United States Patent
Zhang et al.

(10) Patent No.: US 10,665,647 B2
(45) Date of Patent: May 26, 2020

(54) ARRAY SUBSTRATE AND FABRICATION METHOD THEREOF, AND DISPLAY PANEL

(71) Applicant: BOE TECHNOLOGY GROUP CO., LTD., Beijing (CN)

(72) Inventors: Yuxin Zhang, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/973,933

(22) Filed: May 8, 2018

(65) Prior Publication Data

US 2019/0096968 A1    Mar. 28, 2019

(30) Foreign Application Priority Data

Sep. 28, 2017    (CN) .......................... 2017 1 0900389

(51) Int. Cl.
| | | |
|---|---|---|
| *H01L 27/32* | (2006.01) | |
| *H01L 51/56* | (2006.01) | |
| *H01L 51/50* | (2006.01) | |
| H01L 51/00 | (2006.01) | |

(52) U.S. Cl.
CPC ........ *H01L 27/3246* (2013.01); *H01L 51/502* (2013.01); *H01L 51/56* (2013.01); *H01L 51/0013* (2013.01)

(58) Field of Classification Search
CPC .............................. H01L 51/502; H01L 51/56
See application file for complete search history.

(56) References Cited

U.S. PATENT DOCUMENTS

| | | | | |
|---|---|---|---|---|
| 2014/0353612 | A1* | 12/2014 | Hwang | H01L 27/322 257/40 |
| 2015/0137090 | A1* | 5/2015 | Lee | H01L 27/326 257/40 |
| 2016/0351635 | A1* | 12/2016 | Li | H01L 27/3246 |
| 2017/0179209 | A1* | 6/2017 | Kim | H01L 27/3246 |
| 2017/0194395 | A1* | 7/2017 | Hu | H01L 27/3246 |
| 2017/0271419 | A1 | 9/2017 | Cui et al. | |
| 2017/0346008 | A1 | 11/2017 | Xu et al. | |

FOREIGN PATENT DOCUMENTS

| | | |
|---|---|---|
| CN | 105467682 A | 4/2016 |
| CN | 105765739 A | 7/2016 |
| CN | 105826358 A | 8/2016 |

OTHER PUBLICATIONS

Chinese Office Action in corresponding Chinese Application No. 201710900389.9 dated Aug. 5, 2019 (an English translation attached hereto). 15 pages.

\* cited by examiner

*Primary Examiner* — Caridad Everhart
*Assistant Examiner* — Ankush K Singal
(74) *Attorney, Agent, or Firm* — Leason Ellis LLP

(57) ABSTRACT

An array substrate and a fabrication method thereof, and a display panel are provided. The array substrate includes: a base substrate; a first electrode layer and a first pixel defining layer, on the base substrate; a light emitting layer, on the first electrode layer; and a second pixel defining layer, on the first pixel defining layer and the light emitting layer, wherein, the second pixel defining layer overlaps with the light emitting layer in a direction perpendicular to the base substrate.

14 Claims, 3 Drawing Sheets

ARRAY SUBSTRATE AND FABRICATION METHOD THEREOF, AND DISPLAY PANEL

The present application claims priority of Chinese Patent Application No. 201710900389.9 filed on Sep. 28, 2017, the disclosure of which is incorporated herein by reference in its entirety as part of the present application.

TECHNICAL FIELD

Embodiments of the present disclosure relates to an array substrate and a fabrication method thereof, and a display panel.

BACKGROUND

In a field of display technology, fabricating methods of a film layer mainly include an ink-jet printing, a micro transfer printing, a spinning process and the like. When the method such as the ink-jet printing is used for preparing the film layer, after solution of the film layer drops to a pixel region, a liquid level close to a pixel defining layer can be slightly higher than that of a middle region, resulting in a thickness of an edge higher than that of the middle region, i.e., a coffee ring effect is caused, and since there is the "coffee ring effect", the film layer formed in the pixel region is thin in the middle region and thick in the two edges, that is, the film layer is not even, and further display brightness of a display device is not even.

SUMMARY

An embodiment of the present disclosure provides an array substrate, including: a base substrate; a first electrode layer and a first pixel defining layer, on the base substrate; a light emitting layer, on the first electrode layer; and a second pixel defining layer, on the first pixel defining layer and the light emitting layer, wherein, the second pixel defining layer overlaps with the light emitting layer in a direction perpendicular to the base substrate.

For example, an orthogonal projection of the first pixel defining layer on the base substrate is completely located in an orthogonal projection of the second pixel defining layer on the base substrate.

For example, at least a part of the first pixel defining layer has a width decreasing in the direction perpendicular to the base substrate.

For example, the first pixel defining layer overlaps with the light emitting layer in the direction perpendicular to the base substrate.

For example, a portion of an interface between the first pixel defining layer and the light emitting layer is substantially parallel to a main surface of the base substrate.

For example, the portion of the interface between the first pixel defining layer and the light emitting layer is substantially flush with a surface of the first electrode layer away from the base substrate.

For example, the first pixel defining layer includes a stepped structure.

For example, the second pixel defining layer comprises a black photoresist material.

For example, the light emitting layer is a quantum dot light emitting layer or an organic light emitting layer.

For example, a light emitting region of the organic light emitting layer is jointly defined by the first pixel defining layer and the second pixel defining layer.

Another embodiment of the present disclosure provides a display panel, including the array substrate according to any one of claims 1 to 10.

Yet another embodiment of the present disclosure provides a fabrication method of an array substrate, including: forming a first electrode layer and a first pixel defining layer on a base substrate; forming a light emitting layer on the first electrode layer; and forming a second pixel defining layer on the first pixel defining layer, wherein, the second pixel defining layer overlaps with the light emitting layer in a direction perpendicular to the base substrate.

For example, the forming a second pixel defining layer on the first pixel defining layer includes: forming the second pixel defining layer on the first pixel defining layer by a laser transfer printing process, wherein, an orthogonal projection of the first pixel defining layer on the substrate is completely located in an orthogonal projection of the second pixel defining layer on the substrate.

For example, The fabrication method according to claim 12, wherein, the forming a first pixel defining layer on a base substrate includes: forming the first pixel defining layer on the substrate by a laser transfer printing process, wherein, at least a part of the first pixel defining layer has a width decreasing in the direction perpendicular to the base substrate.

For example, the first pixel defining layer includes a stepped structure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those ordinarily skilled in the art can obtain other embodiment(s), without any inventive work, which should be within the scope of the present disclosure.

Figure 1:
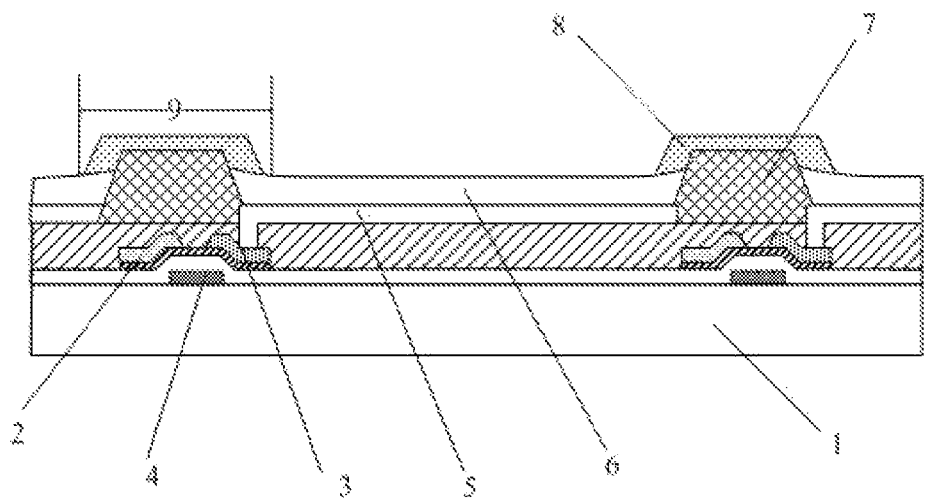
FIG. 1 is a structural diagram of an array substrate according to an embodiment of the present disclosure.

An embodiment of the present disclosure provides an array substrate. Referring to FIG. 1, the array substrate comprises: a base substrate 1, a patterned anode layer 5 and a patterned first pixel defining layer 7 which are formed on the base substrate 1, a light emitting layer 6 covering on the anode layer 5, and a second pixel defining layer 8 formed on the first pixel defining layer 7. The second pixel defining layer 8 covers an edge region 9 of the light emitting layer.

For example, the substrate 1 can be only a base substrate, can also be an array substrate where a thin film transistor array has been formed, or can be another substrate, which is not specifically limited by the present disclosure. For example, the base substrate 1 has two flat main surfaces which are parallel and opposite to each other. The base substrate 1, for example, is a glass substrate or a plastic substrate. The thin film transistor includes a source electrode 2, a drain electrode 3, and a gate electrode 4. The thin film transistor is formed on one of the main surfaces of the base substrate.

In a cross-sectional diagram shown in FIG. 1, the first pixel defining layer 7 has a positive trapezoidal structure. For example, an orthogonal projection of an upper surface of the first pixel defining layer 7 is smaller than or equal to an orthogonal projection of a lower surface thereof on the substrate.

The first pixel defining layer 7 can be a material such as silicone, silicon dioxide $SiO_2$ and the like, or can be other materials, which are not specifically limited by the present disclosure.

The anode layer 5 can be at least one of magnesium, copper, silver, and indium tin oxide, which is not specifically limited by the present disclosure.

The light emitting layer 6, for example, is a quantum dot light emitting layer or an organic light emitting layer.

Although it is not shown, the array substrate can further include a cathode layer formed on the second pixel defining layer 8. The cathode layer, for example, is in direct contact with a portion of the light emitting layer 6 where is exposed by the second pixel defining layer 8.

For example, due to the presence of the first pixel defining layer 7, when the light emitting layer 6 is formed, an uneven region can be generated around the first pixel defining layer 7, and the uneven region generated around the first pixel defining layer 7 is called an edge region of the light emitting layer. An orthogonal projection of the second pixel defining layer 8 on the substrate 1 covers an orthogonal projection of the first pixel defining layer 7 on the substrate 1, so that the second pixel defining layer 8 may completely shield the edge region 9 of the light emitting layer, which may avoid a problem of non-uniform display brightness of a display device caused by a light emitting layer having thin middle region and thick edges in a single pixel unit (i.e., an uneven film layer).

For example, the orthogonal projection of the second pixel defining layer 8 on the substrate 1 covers the orthogonal projection of the first pixel defining layer 7 on the substrate 1. The projection of the first pixel defining layer 7 on the substrate 1 covers an orthogonal projection of the thin film transistor on the substrate 1, and/or the projection of the second pixel defining layer 8 on the substrate 1 covers the orthogonal projection of the thin film transistor on the substrate 1, which can prevent the thin film transistor from generating a leakage current.

A material of the second pixel defining layer 8 can be same with that of the first pixel defining layer 7, and can be a material such as silicone, silicon dioxide $SiO_2$ and the like; and the material of the second pixel defining layer 8 can also be different from that of the first pixel defining layer. For example, the second pixel defining layer 8 is made of a black photoresist material, and the black photoresist material is a material such as resin, polyimide and the like.

The array substrate provided by the embodiment includes: an anode layer and a first pixel defining layer which are formed on a substrate; a light emitting layer covering the anode layer; and a second pixel defining layer formed on the first pixel defining layer, the second pixel defining layer covering an edge region of the light emitting layer. Since the edge region of the light emitting layer is covered by the second pixel defining layer, an uneven region of an edge of the light emitting layer is shielded, an even portion of the light emitting layer can be used for emitting light and displaying, avoiding a problem of non-uniform display brightness of a display device caused by an uneven film layer due to the coffee cup effect.

Figure 2:
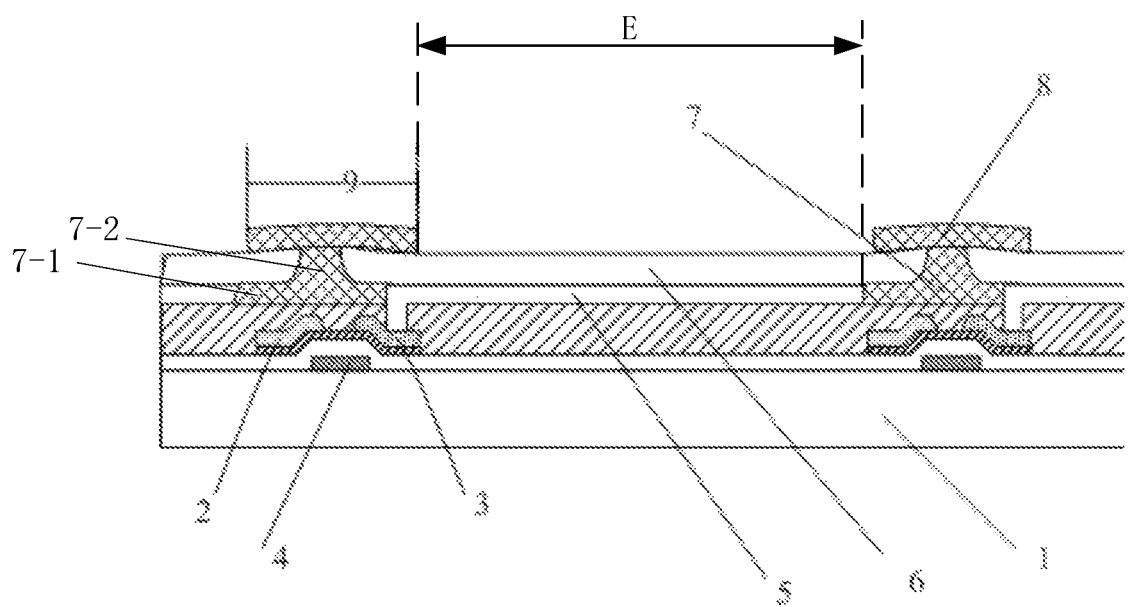
FIG. 2 is a structural diagram of an array substrate according to an embodiment of the present disclosure.

An embodiment of the present disclosure provides an array substrate. Referring to FIG. 2, the array substrate is substantially same with the array substrate shown in FIG. 1, and same parts of the two can be referred to the content of the embodiment shown in FIG. 1. A main difference between the array substrate shown in FIG. 2 and the array substrate shown in FIG. 1 is that the first pixel defining layer 7 and the second pixel defining layer 8 have different structures.

Referring to FIG. 2, the first pixel defining layer 7 has a gradually-contracted structure in a direction perpendicular to the main surface of the base substrate 1 and away from the base substrate 1. The first pixel defining layer 7 has upper and lower surfaces substantially parallel to the base substrate and two side surfaces located between the upper and lower surfaces. In a cross-sectional diagram shown in FIG. 2, at least a portion of the two side surfaces of the first pixel defining layer 7 has an arc shape. For example, the first pixel defining layer 7 adopts a structure with narrow upper portion and wide lower portion, that is, the first pixel defining layer 7 includes a first portion 7-1 closer to the substrate 1 and a second portion 7-2 away from the substrate. An orthogonal projection of the second portion 7-2 on the substrate falls in an orthogonal projection of the first portion 7-1 on the substrate 1; and the orthogonal projection of the first portion 7-1 on the substrate 1 partially overlaps with an orthogonal projection of the second pixel defining layer 8 on the substrate 1. For example, the upper surface of the first portion 7-1 is substantially parallel to the main surface of the base substrate 1. For example, in a position where the light emitting layer 6 interfaces with the first pixel defining layer 7, a surface of the light emitting layer 6 facing to the substrate 1 is substantially flush with a surface of the first pixel defining layer 7 away from the substrate 1. A part of the interface between the light emitting layer 6 and the first pixel defining layer 7 is substantially flush with a surface of the first pixel defining layer 7 away from the substrate 1. An edge region of the light emitting layer 6 is located in a recessed portion formed by the second pixel defining layer 8, the first portion 7-1 and the second portion 7-2.

In the cross-sectional diagram shown in FIG. 2, the second pixel defining layer 8 substantially adopts a rectangular structure, and an orthogonal projection of the second pixel defining layer 8 on the substrate 1 covers an orthogonal projection of the first pixel defining layer 7 on the substrate 1, and in this way, the second pixel defining layer 8 can completely shield a edge region 9 of the light emitting layer, thereby avoiding the problem of non-uniformity of display caused by the coffee ring effect.

In the embodiment shown in FIG. 2, a light emitting region E of the organic light emitting layer 6 is jointly defined by the first pixel defining layer 7 and the second pixel defining layer 8.

Further, for example, an orthogonal projection of the second pixel defining layer 8 on the substrate 1 covers an orthogonal projection of the first pixel defining layer 7 on the substrate 1; the orthogonal projection of the first pixel defining layer 7 on the substrate 1 covers an orthogonal projection of a thin film transistor on the substrate 1, and/or the projection of the second pixel defining layer 8 on the substrate 1 covers the orthogonal projection of the thin film transistor on the substrate 1, so as to prevent the thin film transistor from generating a leakage current.

Figure 3:
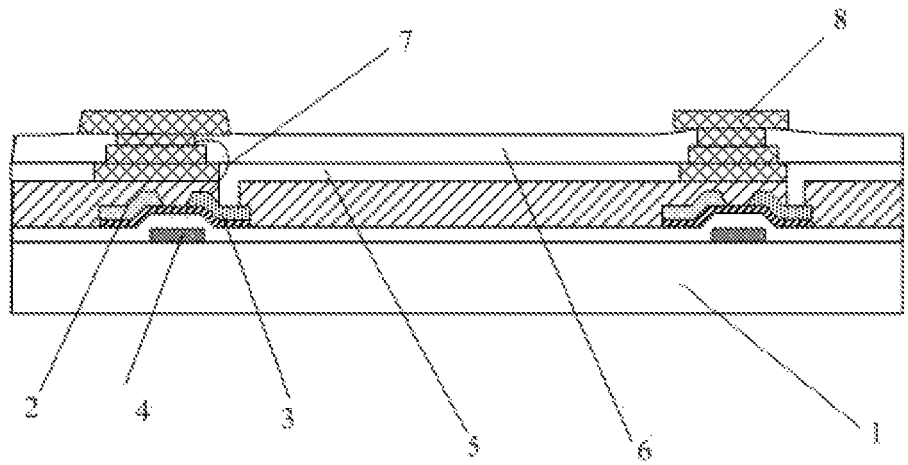
FIG. 3 is a structural diagram of an array substrate according to an embodiment of the present disclosure.

An embodiment of the present disclosure provides an array substrate. Referring to FIG. 3, the array substrate is substantially same with the array substrate shown in FIG. 1, and same parts of the array substrate can be referred to contents of the embodiment shown in FIG. 1. A main difference between the array substrate shown in FIG. 3 and the array substrate shown in FIG. 1 is that the first pixel defining layer and the second pixel defining layer have different structures.

In the embodiment, the first pixel defining layer 7 has a gradually-contracted structure in a direction perpendicular to a main surface of the base substrate 1 and away from the base substrate 1. For example, the first pixel defining layer 7 adopts a stepped structure, and the stepped structure has at least two steps or more steps, which is not specifically limited by the present disclosure. Here, for example, each step, for example, has a right-angled corner. By setting the first pixel defining layer as a stepped structure, slope phenomenon of the light emitting layer can be reduced.

In the cross-sectional diagram shown in FIG. 3, the second pixel defining layer 8 substantially adopts a rectangular structure. An orthogonal projection of the second pixel defining layer 8 on the substrate 1 covers an orthogonal projection of the first pixel defining layer 7 on the substrate 1. In this way, the second pixel defining layer 8 can completely shield an edge region of the light emitting layer, thereby avoiding the problem of non-uniformity of display caused by the coffee ring effect.

Further, for example, an orthogonal projection of the second pixel defining layer 8 on the substrate 1 covers an orthogonal projection of the first pixel defining layer 7 on the substrate 1; the orthogonal projection of the first pixel defining layer 7 on the substrate 1 covers an orthogonal projection of a thin film transistor on the substrate 1, and/or the projection of the second pixel defining layer 8 on the substrate 1 covers the orthogonal projection of the thin film transistor on the substrate 1, so as to prevent the thin film transistor from generating a leakage current.

An embodiment of the present disclosure further provides a display panel, including an array substrate provided by any one of the embodiments described above.

It should be noted that, the display panel in the embodiment can be any product or component having a display function such as a mobile phone, a tablet computer, a television, a notebook computer, a digital photo frame, a navigator and the like.

The display panel has all advantages of the array substrate in the embodiments described above, which will not be repeated in detail here.

Figure 5:
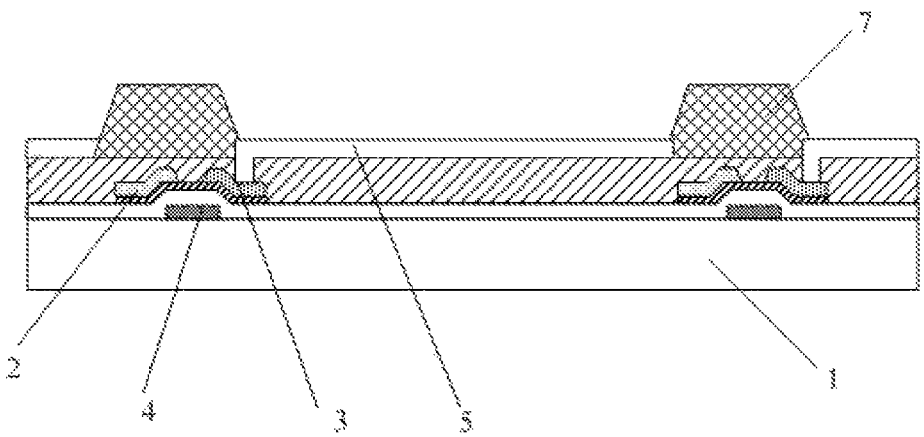
FIG. 5 is a structural schematic diagram of forming an anode layer and a first pixel defining layer in an embodiment of the present disclosure.

An embodiment of the present disclosure provides a fabrication method of an array substrate. Referring to a flowchart of FIG. 4, the fabrication method comprises steps of:

Step 401: forming an anode layer 5 and a first pixel defining layer 7 on a substrate 1, as shown in FIG. 5.

For example, a thin film transistor array can be formed on the substrate 1 at first, and then the anode layer 5 and the first pixel defining layer 7 can be formed on the substrate 1 where the thin film transistor array has been formed by a patterning process.

The first pixel defining layer 7 is formed on the substrate by a laser transfer printing process, and the first pixel defining layer 7 can be a structure with narrow upper portion and wide lower portion, or can be a stepped structure, or can be other structures, for example, a structure of isosceles trapezium.

Figure 6:
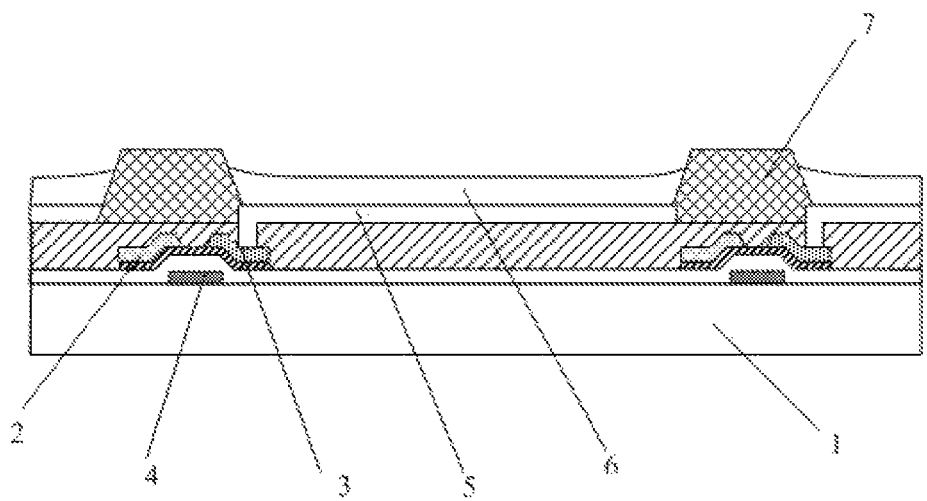
FIG. 6 is a structural schematic diagram of forming a light emitting layer on the anode layer in an embodiment of the present disclosure.

Step 402: forming a light emitting layer 6 on the anode layer 5, as shown in FIG. 6.

A light emitting layer is formed by using an ink-jet printing process.

Step 403: forming a second pixel defining layer 8 on the first pixel defining layer 7, and the second pixel defining layer 8 covering an edge region 9 of the light emitting layer 6, as shown in FIG. 1.

The second pixel defining layer 8 is formed on the first pixel defining layer 7 by a laser transfer printing process, and an orthogonal projection of the second pixel defining layer 8 on the substrate 1 covers an orthogonal projection of the first pixel defining layer 7 on the substrate 1.

For example, a laser having a wavelength of 1064 nm is adopted. The laser passes through a mask and irradiates a transfer printing substrate having a material for forming the second pixel defining layer, and a photothermal conversion layer on the transfer printing substrate converts light energy into heat energy, thereby forming a second pixel defining layer.

Figure 4:
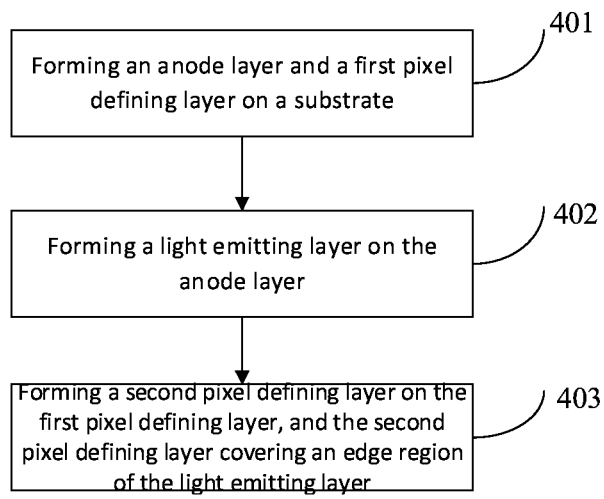
FIG. 4 is a flow chart of a fabrication method of an array substrate according to an embodiment of the present disclosure.

It should be noted that, the array substrates shown in FIG. 2 and FIG. 3 may also be prepared by the fabrication method of the array substrate described above, the preparation processes are the same, which will not be repeated in the present disclosure, and refer to the preparation process in FIG. 4.

The array substrate provided by the embodiment comprises: an anode layer and a first pixel defining layer which are formed on a substrate; a light emitting layer formed on the anode layer and covering the anode layer; and a second pixel defining layer formed on the first pixel defining layer, the second pixel defining layer covering an edge region of the light emitting layer. Since the edge region of the light emitting layer is covered by the second pixel defining layer, an uneven region of an edge of the light emitting layer is shielded, an even portion of the light emitting layer can be used for emitting light and displaying, avoiding a problem of non-uniform display brightness of a display device caused by an uneven film layer due to the coffee ring effect.

It should be noted that, the embodiments of the foregoing method are illustrated as a series of action combinations for simplicity of description, but those skilled in the art should understand that, the present disclosure is not limited by sequence of the described actions, since some steps can be performed in other sequences or performed concurrently in accordance with the present disclosure. Secondly, those skilled in the art should also understand that, the embodiments described herein are all exemplary embodiments, so that the related actions may not be necessary to the present disclosure.

For the embodiments of the method described above, since it is substantially similar to the embodiment of the device, the description is relatively simple, and for the related parts, the description of the embodiment of device can be referred to.

Respective embodiments herein are described in a progressive manner, and each embodiment focuses on the differences from other embodiments, and the same or similar parts among the embodiments can be referred to each other.

Those skilled in the art should easily think that, any combination application of the embodiments herein is feasible, so any combination between the embodiments herein is an implementation solution of the present disclosure, which will not be repeated here in detail because of the limitation of space.

It should be noted that, herein, relational terms such as "first" and "second" and the like are only used to distinguish one entity or operation from another entity or operation, and are not necessarily to require or imply that there are such actual relationship or sequence between these entities or operations. Moreover, the terms "comprise", "include", include not only those elements but also other elements which are not specifically listed, or further include elements which are inherent to such processes, methods, objects or devices. In a case that there is no more limitation, the element defined by the sentence "comprises . . . ", does not exclude the existence of another identical element in the process, the method, the object, or the device including the element.

Moreover, "and/or" in the above indicates that both "and" and "or" relationships are included herein, of which: if a solution A and a solution B are of the "and" relationship, it is indicated that an embodiment may include both the solution A and the solution B; if the solution A and the solution B are of the "or" relationship, it is indicated that an embodiment may only include the solution A, or the solution B.

Although the exemplary embodiments of the present disclosure have been described, those skilled in the art may make additional changes and modifications to these embodiments once they learn the basic inventive concept. Therefore, the appended claims are intended to be interpreted as including the exemplary embodiments and all changes and modifications that fall in the scope of the present disclosure.

An array substrate and a fabrication method thereof, and a display panel provided in the present disclosure have been described in detail above. Herein, specific examples are applied to illustrate the principles and the implementation modes of the present disclosure, the above embodiments are only used to help understanding the method of the present disclosure and core ideas thereof; at the same time, those ordinary skilled in the art will change the specific implementation manner mode and the application scope according to the idea of the present disclosure. In summary, the content of the present specification should not be understood as limitations to the present disclosure.

The invention claimed is:

1. An array substrate, comprising:
    a base substrate;
    a first electrode layer and a first pixel defining layer, on the base substrate;
    a light emitting layer, on the first electrode layer; and
    a second pixel defining layer, on the first pixel defining layer and the light emitting layer,
    wherein, the second pixel defining layer overlaps with the light emitting layer in a direction perpendicular to the base substrate, and a portion of an interface between the first pixel defining layer and the light emitting layer is substantially parallel to the base substrate.

2. The array substrate according to claim 1, wherein, an orthogonal projection of the first pixel defining layer on the base substrate is completely located in an orthogonal projection of the second pixel defining layer on the base substrate.

3. The array substrate according to claim 1, wherein, at least a part of the first pixel defining layer has a width decreasing in the direction perpendicular to the base substrate.

4. The array substrate according to claim 3, wherein, the first pixel defining layer overlaps with the light emitting layer in the direction perpendicular to the base substrate.

5. The array substrate according to claim 1, wherein, the portion of the interface between the first pixel defining layer and the light emitting layer is substantially flush with a surface of the first electrode layer away from the base substrate.

6. The array substrate according to claim 3, wherein, the first pixel defining layer includes a stepped structure.

7. The array substrate according to claim 1, wherein, the second pixel defining layer comprises a black photoresist material.

8. The array substrate according to claim 1, wherein, the light emitting layer is a quantum dot light emitting layer or an organic light emitting layer.

9. The array substrate according to claim 1, wherein, a light emitting region of the organic light emitting layer is jointly defined by the first pixel defining layer and the second pixel defining layer.

10. A display panel, comprising the array substrate according to claim 1.

11. A fabrication method of an array substrate, comprising:
    forming a first electrode layer and a first pixel defining layer on a base substrate;
    forming a light emitting layer on the first electrode layer; and
    forming a second pixel defining layer on the first pixel defining layer,
    wherein, the second pixel defining layer overlaps with the light emitting layer in a direction perpendicular to the base substrate, and a portion of an interface between the first pixel defining layer and the light emitting layer is substantially parallel to the base substrate.

12. The fabrication method according to claim 11, wherein, the forming a second pixel defining layer on the first pixel defining layer includes:
    forming the second pixel defining layer on the first pixel defining layer by a laser transfer printing process, wherein, an orthogonal projection of the first pixel defining layer on the substrate is completely located in an orthogonal projection of the second pixel defining layer on the substrate.

13. The fabrication method according to claim 11, wherein, the forming a first pixel defining layer on a base substrate includes:
    forming the first pixel defining layer on the substrate by a laser transfer printing process,
    wherein, at least a part of the first pixel defining layer has a width decreasing in the direction perpendicular to the base substrate.

14. The fabrication method according to claim 11, wherein, the first pixel defining layer includes a stepped structure.

* * * * *